United States Patent
Zhu et al.

(10) Patent No.: US 7,202,177 B2
(45) Date of Patent: *Apr. 10, 2007

(54) NITROUS OXIDE STRIPPING PROCESS FOR ORGANOSILICATE GLASS

(75) Inventors: Helen Zhu, Fremont, CA (US); Rao Annapragada, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/680,895

(22) Filed: Oct. 8, 2003

(65) Prior Publication Data

US 2005/0079710 A1    Apr. 14, 2005

(51) Int. Cl.
*H01L 21/302* (2006.01)
*H01L 21/4763* (2006.01)

(52) U.S. Cl. .............. 438/710; 438/725; 438/723; 438/638; 438/640; 257/E21.214

(58) Field of Classification Search ............ 438/689, 438/710–711, 725, 638, 640, 670
See application file for complete search history.

(56) References Cited

U.S. PATENT DOCUMENTS

| | | | |
|---|---|---|---|
| 5,126,231 A * | 6/1992 | Levy | 430/313 |
| 5,970,376 A * | 10/1999 | Chen | 438/637 |
| 6,413,877 B1 | 7/2002 | Annapragada | |
| 6,498,112 B1 | 12/2002 | Martin et al. | |
| 6,566,283 B1 * | 5/2003 | Pangrle et al. | 438/788 |
| 6,696,222 B2 * | 2/2004 | Hsue et al. | 430/313 |
| 6,720,256 B1 * | 4/2004 | Wu et al. | 438/638 |
| 6,916,697 B2 * | 7/2005 | Zhu et al. | 438/212 |
| 2002/0111041 A1 | 8/2002 | Annapragada et al. | |
| 2004/0036076 A1* | 2/2004 | Arita et al. | 257/79 |
| 2005/0014362 A1* | 1/2005 | Ho et al. | 438/637 |

* cited by examiner

*Primary Examiner*—Thanh Nguyen
(74) *Attorney, Agent, or Firm*—Virtual Legal, P.C.; Michael A. Kerr

(57) ABSTRACT

A method of stripping an integrated circuit (IC) structure having a photoresist material and an organosilicate glass (OSG) material is described. The method comprises feeding a nitrous oxide ($N_2O$) gas into a reactor, generating a plasma in the reactor and stripping the photoresist. The stripping process provides a high selectivity between the photoresist and the OSG material.

22 Claims, 7 Drawing Sheets

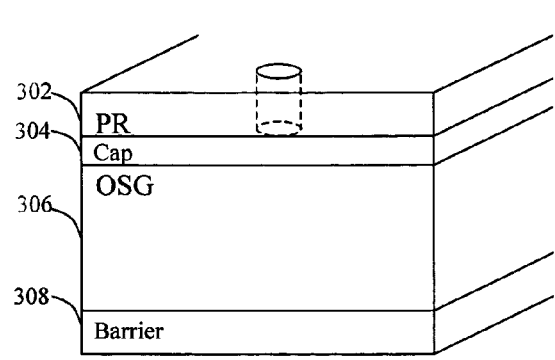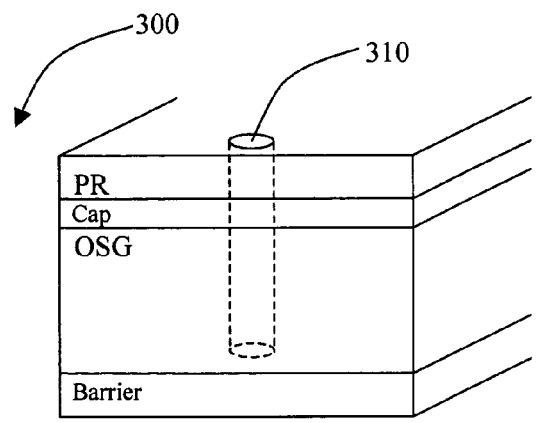
FIG. 3A    FIG. 3B
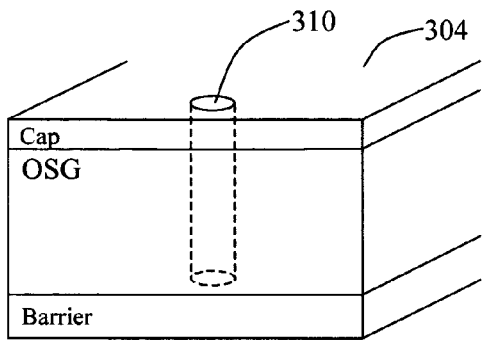
FIG. 3C
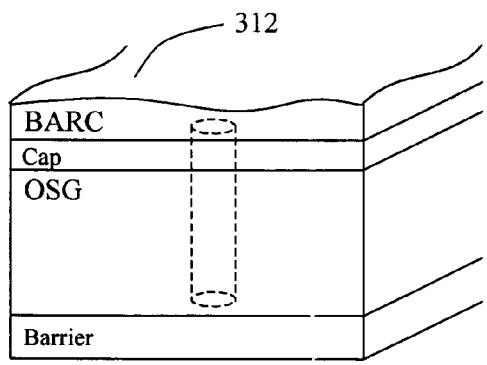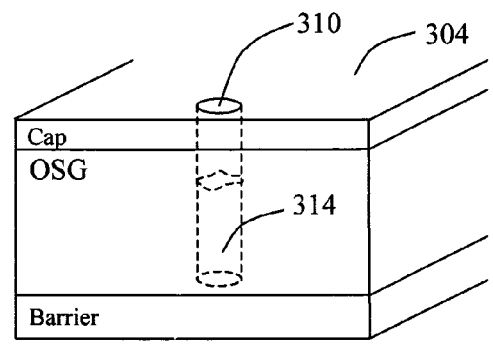
FIG. 3D    FIG. 3E

NITROUS OXIDE STRIPPING PROCESS FOR ORGANOSILICATE GLASS

RELATED APPLICATIONS

This patent application is related to commonly assigned U.S. patent application Ser. No. 10/680,894 entitled AN ETCH BACK PROCESS USING NITROUS OXIDE, by Zhu et al., filed concurrently herewith and incorporated herein by reference.

BACKGROUND

1. Field of Invention

The present invention relates to the stripping of a photoresist. More particularly, the invention relates to the stripping of a photoresist from an IC structure having an organosilicate glass (OSG) material.

2. Description of Related Art

In semiconductor integrated circuit (IC) fabrication, devices such as component transistors are formed on a semiconductor wafer substrate that is typically made of silicon. During the fabrication process, various materials are deposited on the different layers in order to build a desired IC. Typically, conductive layers may include patterned metallization lines, polysilicon transistor gates and the like which are insulated from one another with dielectric materials. The dielectric materials have been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitances.

In general, the coupling capacitance in an integrated circuit is directly proportional to the dielectric constant, k, of the material used to form the dielectric layers. As noted above, the dielectric layers in prior art integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

One particular material that is being used as a low-k dielectric is organosilicate glass (OSG). OSG is a low-k material that can be deposited either by spin-on or CVD methods. The typical OSG k value ranges from 2.6 to 2.8. Porous OSG (pOSG) can also be used for low-k applications. Typically, porous materials such as pOSG are applied using spin-on methods and with controlled evaporation of the solvent providing the desired pore structure.

Typically, low-k materials are incorporated into IC fabrication using a copper dual damascene process. A dual damascene structure employs an etching process that creates trenches for lines and holes for vias. The vias and trenches are then metallized to form the interconnect wiring. The two well-known dual damascene schemes are referred to as a via first sequence and a trench first sequence.

In prior art methods, the organic photoresist is stripped or removed using well known gas mixtures such as oxygen ($O_2$), a combination of nitrogen and oxygen ($N_2/O_2$), a combination of nitrogen and hydrogen ($N_2/H_2$), or ammonia ($NH_3$). Each of these gases or gas mixtures reacts negatively to an IC structure having an organosilicate glass (OSG) dielectric. For example, the use of oxygen ($O_2$) raises the k value of the OSG dielectric. The etch rate for the nitrogen and hydrogen ($N_2/H_2$) gas mixture is relatively low and has relatively high power demands that causes OSG faceting. Furthermore, the use of ammonia ($NH_3$) may result in particle generation. Thus, each of these well known gases or gas mixture has an associated limitation when stripping a photoresist from an IC structure with OSG materials.

SUMMARY

A method of stripping an integrated circuit (IC) structure having a photoresist material and an organosilicate glass (OSG) material is described. The method comprises feeding a nitrous oxide ($N_2O$) gas mixture into a reactor, generating a plasma in the reactor and stripping the photoresist. The stripping process provides a high selectivity between the photoresist and the OSG material. In the illustrative embodiment, the photoresist is an organic photoresist. The method permits the stripping of the photoresist and other such organic material to be performed in the same reactor used for etching the OSG material. The method of stripping the photoresist is one of a plurality of steps performed during a dual damascene process.

In the illustrative embodiment, the stripping process is applied to an illustrative integrated circuit (IC) structure that includes a first photoresist layer, a second intermediate layer, and a third organosilicate glass (OSG) layer. In the illustrative embodiment, the method feeds nitrous oxide ($N_2O$) into a reactor. A plasma is then generated and the photoresist is stripped from the IC structure. There is a high selectivity between the first photoresist layer and the second intermediate layer. Additionally, there is a high selectivity between the first photoresist layer and the third OSG layer.

The method is applied to a via first etch sequence in which a via is etched into an IC structure where the second intermediate layer is a cap layer. The illustrative cap layer is configured to provide protection to the OSG layer during the reworking of the photoresist layer. By way of example and not of limitation, the illustrative cap layer is a silicon and oxygen containing material such as Silicon Dioxide ($SiO_2$) or Silicon Oxynitride (SiON). The illustrative via first method includes etching a via into the illustrative IC structure. The method then proceeds to apply an antireflective coating (ARC) or bottom antireflective coating (BARC) that fills the via of the illustrative IC structure. A $N_2O$ gas mixture is then applied to etch back the ARC or BARC and results in generating an organic plug having the desired height within the via. Thus, in the illustrative IC structure, the organic plug occupies a portion of the third OSG layer. The method then proceeds to etch a trench into the second cap layer and the third OSG layer. A $N_2O$ gas mixture is then fed into the reactor and generates a plasma that strips the photoresist layer and the organic plug.

The method may also be applied to a trench first etch sequence in which the second intermediate layer is a hardmask layer. By way of example and not of limitation, the hardmask layer may be composed of such materials as Silicon Nitride ($Si_3N_4$), Tantalum Nitride (TaN), Titanium Nitride (TiN), and Silicon Carbide (SiC). Using the trench pattern in the first photoresist layer, a trench is etched into the second hardmask layer. The first photoresist layer is then stripped with the $N_2O$ gas mixture. Another first photoresist layer that is patterned for via etching is applied. A via is then etched into the second hardmask layer, and the third OSG layer. The method then proceeds to apply an antireflective coating (ARC) or bottom antireflective coating (BARC) that fills the via of the illustrative IC structure. As described for the via first etch, the $N_2O$ gas mixture is then applied to etch back the ARC or BARC and results in generating an organic plug having the desired height within the via. Using the previously etched trench pattern in the second hardmask layer, the third OSG layer is then trench etched. A $N_2O$ gas mixture is then used to remove the organic plug.

BRIEF DESCRIPTION OF THE DRAWINGS

Illustrative embodiments of the present invention are shown in the accompanying drawings wherein:

FIG. 3A through FIG. 3H is an isometric view of the via etch and strip sequence of the flowchart in FIG. 2.

DETAILED DESCRIPTION

In the following detailed description, reference is made to the accompanying drawings, which form a part hereof, and in which is shown by specific embodiments. These embodiments are described in sufficient detail to enable those skilled in the art to practice the invention, and it is to be understood that other embodiments may be utilized and that structural, logical and electrical changes may be made without departing from the spirit and scope of the claims. The following detailed description is, therefore, not to be taken in a limited sense. Note, the leading digit(s) of the reference numbers in the Figures correspond to the figure number, with the exception that identical components which appear in multiple figures are identified by the same reference numbers.

Figure 1:
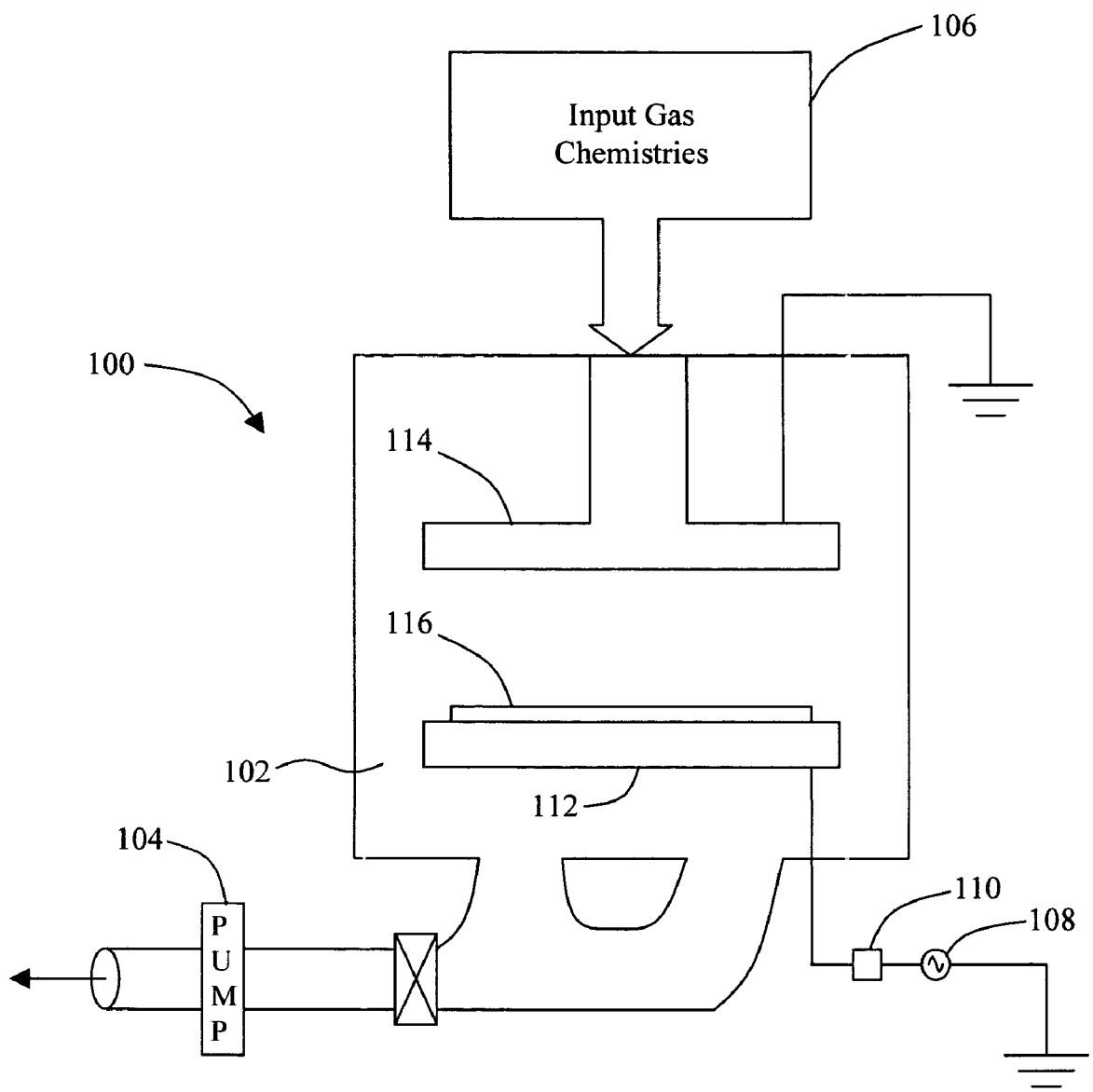
FIG. 1 is an illustrative apparatus capable of removing a photoresist from an IC structure having a photoresist layer and an OSG layer.

Referring to FIG. 1 there is shown an illustrative system for stripping photoresist from an IC structure having an OSG layer. The illustrative system is also configure to perform hard mask etching, and dielectric etching. The illustrative system is a parallel plate plasma system 100 such as a 200 mm EXELAN HPT system available from Lam Research Corporation (Lam) from Fremont, Calif. Additionally, other systems from Lam such as the EXELAN 2300 series may also be used. The system 100 includes a chamber having an interior 102 maintained at a desired vacuum pressure by a vacuum pump 104 connected to an outlet in a wall of the reactor. Etching gas can be supplied to the plasma reactor supplying gas from gas supply 106. A medium density plasma can be generated in the reactor by a dual frequency arrangement wherein RF energy from RF source 108 is supplied through a matching network 110 to a powered electrode 112. The RF source 108 is configured to supply RF power at 27 MHz and 2 MHz. Electrode 114 is a grounded electrode. A substrate 116 is supported by the powered electrode 112 and is etched and/or stripped with plasma generated by energizing the gasses into a plasma state. Other capacitively coupled reactors can also be used such as reactors where RF power is supplied to both electrodes such as the dual frequency plasma etch reactor described in commonly owned U.S. Pat. No. 6,090,304, the disclosure of which is hereby incorporated by reference.

Alternatively, the plasma can be produced in various other types of plasma reactors referred to as inductively coupled plasma reactor, an electron-cyclotron resonance (ECR) plasma reactor, a helicon plasma reactor, or the like. Such plasma reactors typically have energy sources which use RF energy, microwave energy, magnetic fields, etc. to produce a medium to high density plasma. For instance, a high density plasma could be produced in a Transformer Coupled Plasma etch reactor available from Lam Research Corporation which is also called an inductively coupled plasma reactor.

Figure 2:
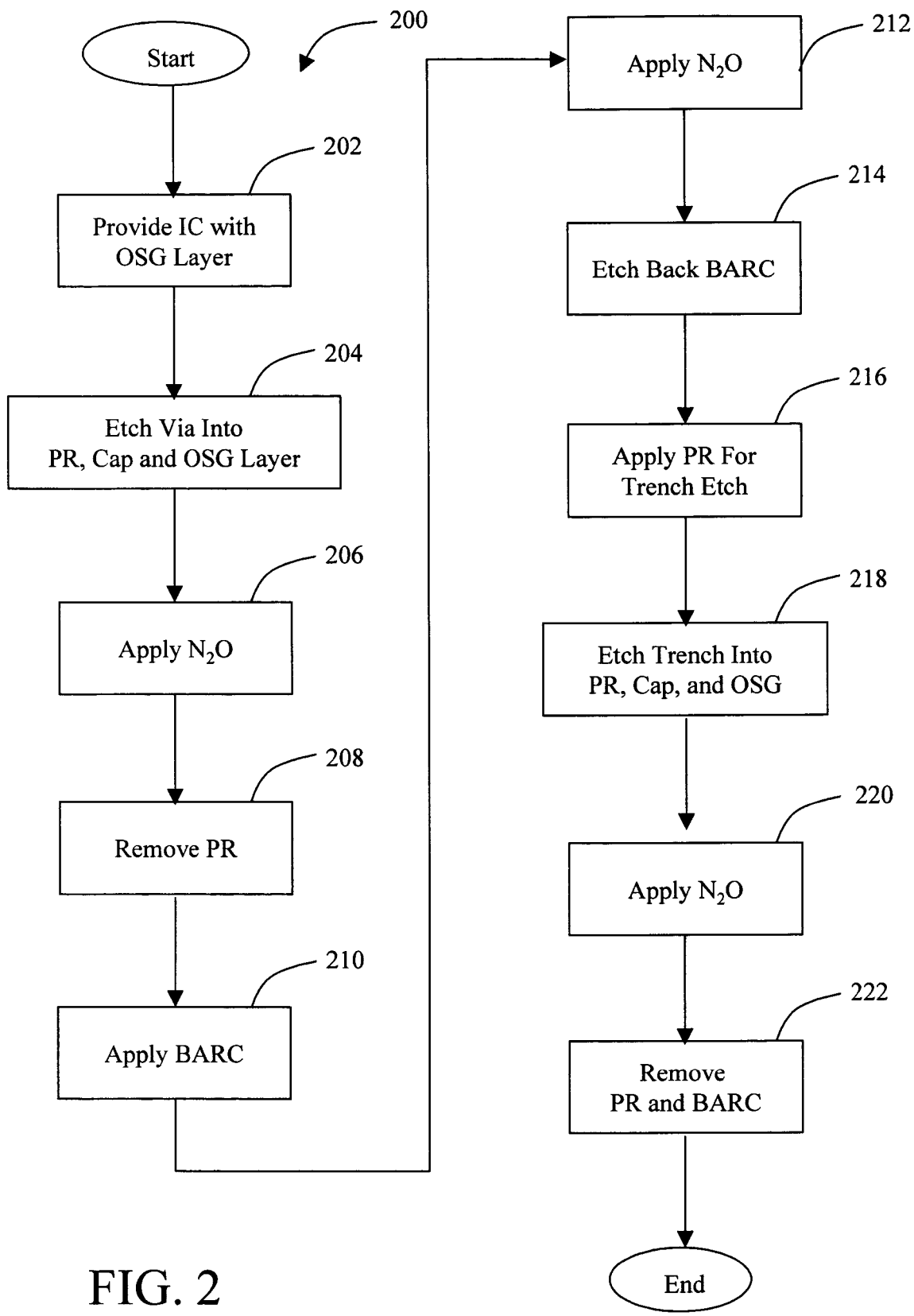
FIG. 2 is a flowchart for stripping photoresist in a via first dual damascene process.

Referring to FIG. 2 there is shown a flowchart for stripping a photoresist in a via first dual damascene process. The illustrative IC structure includes a first organic photoresist layer, a second intermediate layer, a third OSG layer, and a fourth barrier layer. By way of example and not of limitation, the photoresist layer is an organic photoresist such as the 193 nm photoresist or 248 nm photoresist from the Shipley Company. The illustrative second intermediate layer is a cap layer composed of such cap materials as Silicon Dioxide ($SiO_2$), Silicon Oxynitride (SiON), and any other such silicon and oxygen containing materials. The cap layer provides protection to the OSG layer during the reworking of the photoresist layer. The third layer is an OSG layer and may include materials such as CORAL™ from Novellus Systems of San Jose, Calif., and BLACK DIAMOND™ from Applied Materials of Santa Clara, Calif., or any other such OSG materials. Additionally, it shall be appreciated by those skilled in the art that the OSG material may also be a porous OSG (pOSG) material. By way of example and not of limitation, the pOSG may have a void space of greater than 30%. The illustrative fourth barrier layer is composed of such barrier materials as silicon nitride ($Si_3N_4$), silicon carbide (SiC), or any other such silicon based material. The barrier layer provides protection from copper diffusion.

The flowchart in FIG. 2 describes the method 200 for performing a via first etch sequence in which a via is etched into the IC structure where the second intermediate layer is a cap layer. The method is initiated at process block 202 in which the IC structure is positioned in the illustrative reactor 100. The IC structure includes a via patterned photoresist layer. Those skilled in the art shall appreciate that the generation of a patterned via or trench presumes completing the photolithography on the first photoresist layer. As is well known in the art, photolithography uses a light sensitive photoresist that is baked and exposed to a controlled light source. The light passes through a reticle that transfers the desired pattern.

At block 204 a via is etched into the second cap layer, and the third OSG layer. The via is etched up to the barrier layer. At block 206, $N_2O$ is added to the reaction chamber and a plasma is generated. In a rather broad embodiment, the range for the processing parameters may be practiced at operating pressures of 10–1000 mTorr, at power ranges of 0 to 1000 W for RF power, and at $N_2O$ flow rates of 50–2000 sccm. In a less broad embodiment having a RF source configured to supply RF power at 27 MHz and 2 MHz or more, the range for the processing parameters may be practiced at operating pressures of 50–600 mTorr, at 100–600 W for 27 MHz RF power, at 50–600 W for 2 MHz RF power, and at $N_2O$ flow rates of 200–1500 sccm. In an even less broad embodiment that is applied to a 200 mm wafer or substrate, the range for the processing parameters may be practiced at operating pressures of 100–350 mTorr, at 100–200 W for 27 MHz RF power, at 100–200 W for 2 MHz RF power, and at $N_2O$ flow rates of 300–900 sccm. Additionally, an inert gas may be used as a diluent for each of the embodiments described. By way of example and not of limitation, the inert gas may include nobles gases such as Argon, Helium, Neon, Krypton, and Xeon. The inert gas may be used to control uniformity during the removal of the photoresist.

A plurality of different process parameters for adding $N_2O$ to the illustrative system 100 is shown in Table 1.

TABLE 1

Illustrative Process Parameter
For Stripping Photoresist with $N_2O$

| Run # | Pressure (mTorr) | 27 MHz RF Power (W) | 2 MHz RF Power (W) | $N_2O$ Flow Rate (sccm) | Photoresist Strip Rate (Å/min) |
|---|---|---|---|---|---|
| 1 | 350 | 100 | 100 | 900 | 2960 |
| 2 | 100 | 100 | 100 | 300 | 3451 |
| 3 | 100 | 100 | 200 | 900 | 4655 |
| 4 | 100 | 200 | 100 | 900 | 4857 |
| 5 | 225 | 150 | 150 | 600 | 5628 |
| 6 | 350 | 200 | 100 | 300 | 5779 |
| 7 | 350 | 100 | 200 | 300 | 6091 |
| 8 | 100 | 200 | 200 | 300 | 6735 |
| 9 | 350 | 200 | 200 | 900 | 7895 |

In table 1, the process parameters for a number of different "runs" are shown. The runs were performed on a 200 mm wafer at 20° C. During each run the pressure, power and $N_2O$ flow rate are adjusted. The resulting photoresist strip rate is shown at the far right of Table 1.

It shall be appreciated by those skilled in the art that the optimal flow rates and ratios for the illustrative gas mixture of Table 1 may change depending on the type of plasma etch chamber, the substrate size, and other such variables that are well known to those skilled in the art. Furthermore, it shall also be appreciated by those of ordinary skill in the art that the selection of temperatures, power level, and gas pressures used in practicing the present invention can vary widely and that those specified herein are give by way of example, and not as a limitation.

At block 208, the plasma strips the photoresist from the structure and generates a volatile by-product such as carbon dioxide ($CO_2$). For purposes of removing the photoresist, it is generally desirable to achieve higher photoresist strip rates without damaging the OSG layer. There is a high selectivity between the first photoresist layer and the second cap layer. Additionally, there is a high selectivity between the first photoresist layer and the third OSG layer.

The method then generates an organic plug for the via. The organic plug is used to prevent via faceting and to preserve the barrier layer during the trench etch process. At process block 210, the organic plug is generated by applying an organic material using an organic spin-on technique. By way of example and not of limitation, the organic material is an antireflective coating (ARC) or a bottom antireflective coating (BARC). The illustrative organic ARC and/or BARC is designed to absorb light.

At process block 212, $N_2O$ is added to the illustrative reactor 100 using the illustrative process parameters described above. At block 214, the $N_2O$ gas is energized and the BARC or organic material is etched back to produce the desired "organic plug". By way of example and not of limitation, the organic plug has a plug height that is either equal to the desired trench height, or exceeds the desired trench height. The plug height needs to be of sufficient height to prevent fence formation and to prevent via faceting. A more detailed discussion about the method for generating an organic plug is described in further detail in the patent application titled "AN ETCH BACK PROCESS USING NITROUS OXIDE" which is being filed concurrently herewith and which is hereby incorporated by reference.

At block 216, another photoresist layer is applied. The photoresist is patterned for the trench etch sequence. The method then proceeds to block 218 in which a trench is etched into the second cap layer and the third OSG layer. At block 220, $N_2O$ is again applied using the process parameters described above. At block 222, the $N_2O$ is energized and the organic plug and the photoresist layer are both removed.

Those skilled in art having the benefit of this disclosure shall appreciate that the method described above permits the stripping of the photoresist to be performed in the same reactor that is used for etching the hardmask layer and the OSG layer. This results in greatly reducing cycle time as there is no need to transfer the wafer to another reaction chamber for stripping. Additionally, since the wafer or substrate is not exposed to ambient moisture, any polymers generated during etching that were difficult to remove due to exposure to ambient moisture, can now be more easily removed in the subsequent strip/clean processes. Further still, in-situ strip also reduces the need to perform a waferless auto clean to remove polymers deposited on the chamber walls from the etch process. Furthermore, it shall be appreciated by those skilled in the art having the benefit of this disclosure that the systems and methods described in this specification may be used in ex-situ applications.

Referring to Table 2, there is shown the $N_2O$ strip process being compared to a variety of other commonly used stripping gasses or gas mixtures. By way of example and not of limitation, the other gases or gas mixtures include ammonia ($NH_3$), oxygen ($O_2$), and the nitrogen and hydrogen ($N_2/H_2$) gas mixture. During the comparison of the gasses a Fourier Transform Infrared (FTIR) spectrophotometer was used to detect changes in an illustrative OSG material. For the comparison, a blanket CORAL™ wafer was used as the illustrative OSG material. During the experiment, the CORAL™ wafer was exposed to different gasses to determine changes in the ratio of the Si—C peak to the SiO peak. The Si—C and SiO peaks indicate changes to the OSG material.

TABLE 2

Comparison of Various Gases
Stripping a Photoresist from an OSG Layer

| Gas Mixture | Flow Rate (sccm) | Pressure (mTorr) | 27 MHz RF Power (W) | 2 MHz RF Power (W) | Strip Rate (Å/min) | Change in SiC/SiO Ratio |
|---|---|---|---|---|---|---|
| $N_2O$ | 300 | 350 | 200 | 100 | 5779 | 1.8% |
| $NH_3$ | 1500 | 350 | 600 | 0 | 5470 | 2.5% |
| $O_2$ | 1000 | 330 | 200 | 100 | 10595 | 4.1% |
| $N_2/H_2$ | 1900 ($N_2$) 600 ($H_2$) | 470 | 400 | 400 | 4150 | 5.0% |

Table 2 shows that the $N_2O$ results in the lowest change in the SiC/SiO ratio which indicates that the OSG material is affected least by the $N_2O$ stripping. Notice that the $N_2O$ a strip rate is comparable to the $NH_3$ strip rate, however $N_2O$ stripping operates with significantly lower power demands than NH$_3$ stripping. Additionally, N$_2$O stripping may avoid the particle generation associated with NH$_3$ stripping. Furthermore as shown in Table 2, the N$_2$O stripping process is a milder oxidant than O$_2$ which results in less oxidation of the OSG material. Less oxidation of the OSG material is desirable because oxidation raises the k value of the OSG materials.

Figure 3F:
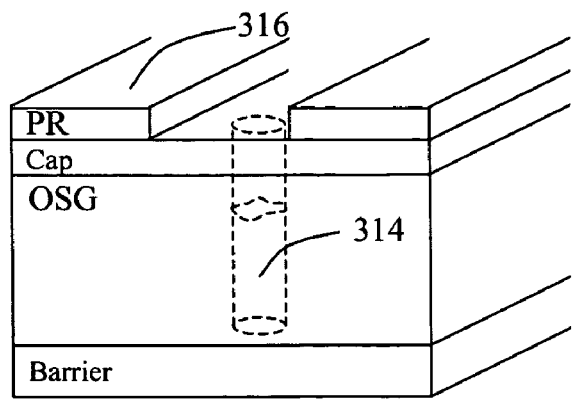

Referring to FIG. 3A through FIG. 3H there is shown an isometric view of the via etch and strip sequence of the flowchart in FIG. 2. FIG. 3A shows an isometric view of the illustrative IC structure having a first organic photoresist 302, a second intermediate cap layer 304, a third OSG layer 306, and a fourth barrier layer 308. As described above, the illustrative IC structure is positioned in the illustrative reactor 100. FIG. 3B shows the illustrative IC structure after performing the via first etch in process 204 where the via 310 is etched into the second cap layer 304 and the third OSG layer 306.

In FIG. 3C there is shown the illustrative IC structure after having added the N$_2$O from process 206, and stripping the photoresist layer 302 from process 308. The remaining IC structure includes inter alia the visible cap layer 304 and the via 310.

Referring to FIG. 3D there is shown the illustrative IC structure after adding an organic material such as BARC 312 as described in process block 210. In FIG. 3E, an organic plug 314 is shown within the via 310. The organic plug 314 is generated by applying N$_2$O and then etching back the organic plug 314 as described in block 212 and block 214. In FIG. 3F, the IC structure is shown after adding a layer of photoresist 316 as described in block 216. The photoresist 316 is patterned for trench etching.

Figure 3G:
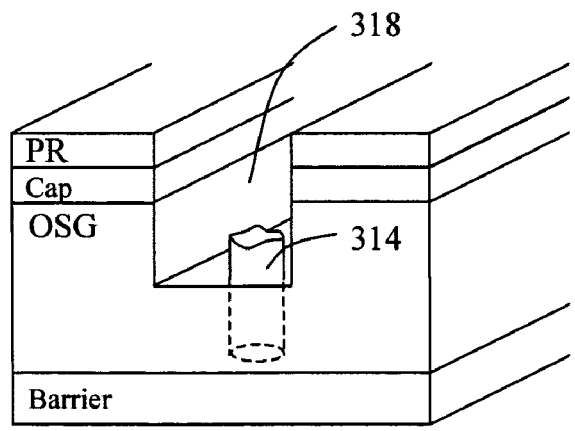
Figure 3H:
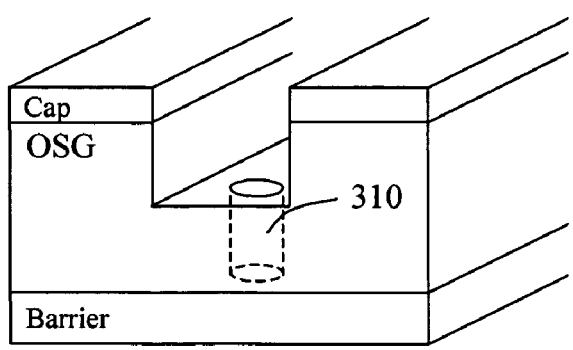

The trench 318 is then etched as shown in FIG. 3G according to the trench etch process 218. The trench 318 is etched into the second cap layer and the third OSG layer. The organic plug 314 prevents the faceting of the via 310. At FIG. 3H, the IC structure is shown after stripping the photoresist and the organic plug using the N$_2$O strip process described in block 220 and block 222.

It shall be appreciated by those of ordinary skill in the art having the benefit of this disclosure that the method 200 permits the stripping of the photoresist to be performed in the same reactor used for etching the photoresist and the OSG material. The benefits of performing the stripping and etching process in the same reaction chamber are described above. Additionally, those skilled in the art having the benefit of this disclosure shall appreciate that the systems and methods described in this specification may be used in ex-situ applications.

Figure 4:
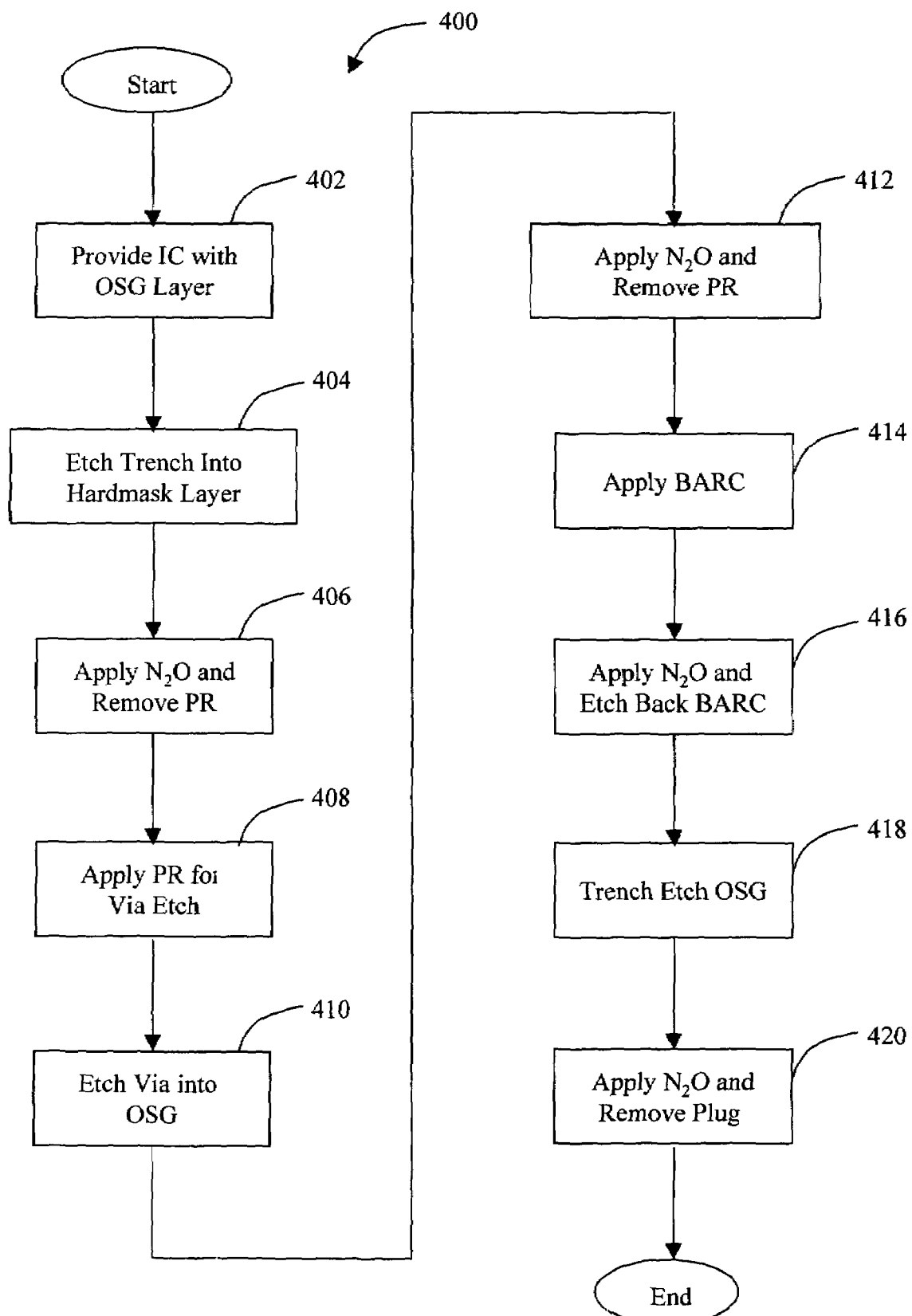
FIG. 4 is a flowchart for stripping photoresist in a trench first dual damascene process.

Referring to FIG. 4 there is shown a flowchart for a method of stripping a photoresist in a trench first dual damascene process. The photoresist is applied to an IC structure that includes an OSG layer. The illustrative IC structure includes a first organic photoresist layer, a second intermediate layer, a third OSG layer, and a fourth barrier layer. The photoresist layer is an organic photoresist as described above. The illustrative second intermediate layer is a hardmask layer composed of such hardmask materials as silicon nitride (Si$_3$N$_4$), tantalum nitride (TaN), titanium nitride (TiN), or silicon carbide (SiC). The hardmask material is used instead of a cap layer because the IC structure is directly exposed to plasma during the etching process without the benefit of a photoresist. The third layer is an OSG layer such as CORAL™, and BLACK DIAMOND™ or any other such OSG materials. Additionally, the OSG material may also be a porous OSG (pOSG) material as described above. The illustrative fourth barrier layer is composed of such barrier materials as silicon nitride (Si$_3$N$_4$), or silicon carbide (SiC) as described above.

The flowchart in FIG. 4 describes the method 400 for performing a trench etch in the illustrative structure having an intermediate hardmask layer. The method is initiated at process block 402 in which the illustrative IC structure having a trench patterned into the photoresist layer is positioned in the illustrative reactor 100. The method then proceeds to process step 404 in which a trench is etched into the second intermediate hardmask layer.

At process block 406, N$_2$O is added to the reaction chamber and a plasma is generated. The operating parameters for the removal of the photoresist are similar to those described above. The plasma strips the photoresist from the structure and generates a volatile by-product such as CO$_2$. There is a high selectivity between the first photoresist layer and the second hardmask layer. Additionally, there is a high selectivity between the first photoresist layer and the third OSG layer.

At process block 408, another first photoresist layer is added to the IC structure. This other photoresist layer is patterned to for via etching. At block 410, a via is then etched into the second hardmask layer, and the third OSG layer. It shall be appreciated by those of ordinary skill in the art that the gases and process parameters used for via etching are dependent on a variety of parameters such as the type of hardmask material, and OSG materials.

At block 412, N$_2$O is again applied to illustrative system 100 at process parameters that are described above. The plasma is then formed when the N$_2$O is energized and the via patterned photoresist layer is then stripped with the N$_2$O plasma.

The method then proceeds to generate an organic plug for the via. At block 414, the organic plug is generated by first applying an organic material such as BARC or ARC as described above. At block 416, N$_2$O is used to etch back the BARC or ARC to produce the desired organic plug as described above.

At block 418, the previously etched trench pattern in the hardmask layer is used to trench etch the third OSG layer. As previously noted, the gases and process parameters for performing the trench etch are dependent on such parameters as the IC structure such as the hardmask material and OSG materials. Finally, at block 420, a N$_2$O plasma is used to remove the organic plug.

Figure 5A:
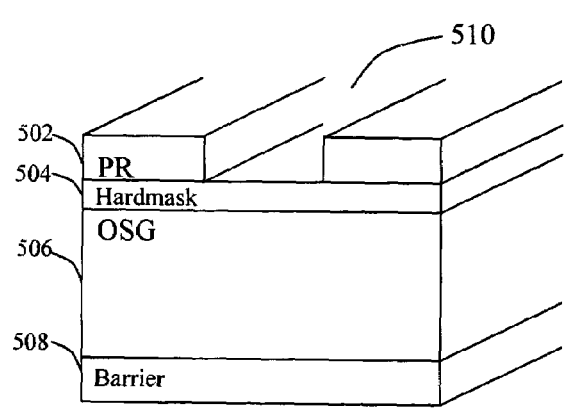
FIG. 5A through FIG. 5J is an isometric view of the trench etch and strip sequence of the flowchart in FIG. 4.
Figure 5B:
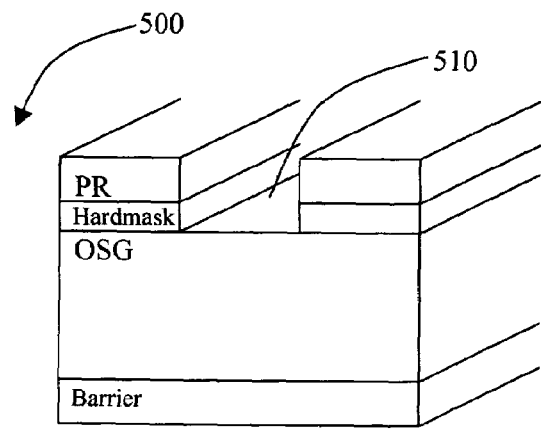

Referring to FIG. 5A through FIG. 5J there is shown an isometric view of the trench etch and strip sequence 500 described in the flowchart in FIG. 4. FIG. 5A shows an isometric view of the illustrative IC structure having a first organic photoresist layer 502, a second intermediate hardmask layer 504, a third OSG layer 506, and a fourth barrier layer 508. The first organic photoresist layer has a trench 510 patterned into the photoresist layer. As described above, the illustrative IC structure is positioned in the illustrative reactor 100. FIG. 5B shows the illustrative IC structure after performing the process 404 in which the trench 510 is etched into the second hardmask layer 504.

Figure 5C:
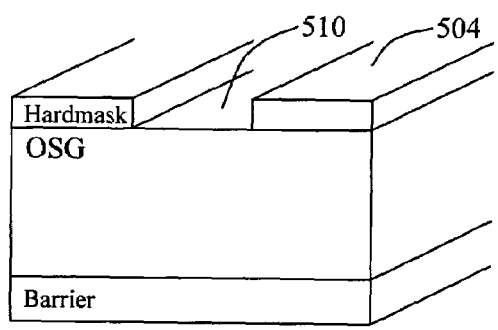

In FIG. 5C there is shown the illustrative IC structure after having added the N$_2$O from process 406 to chamber 100. The N$_2$O is converted to a plasma that strips the photoresist layer 502 and leaves the trench etched hardmask layer 504.

Figure 5D:
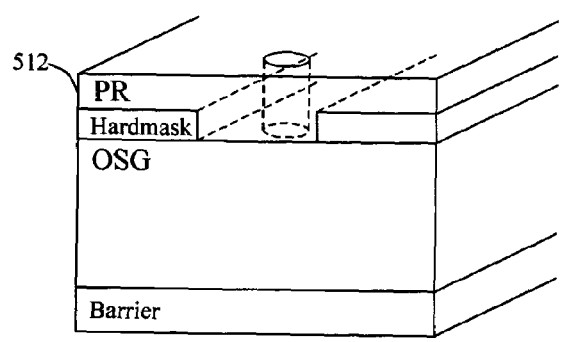
Figure 5E:
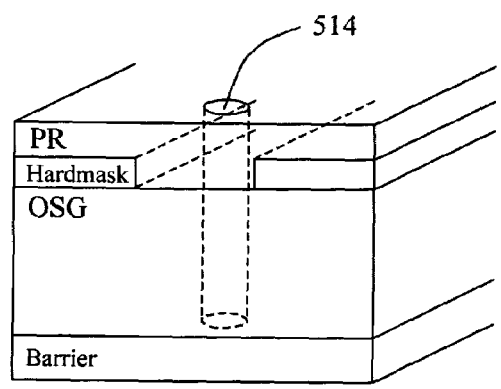
Figure 5F:
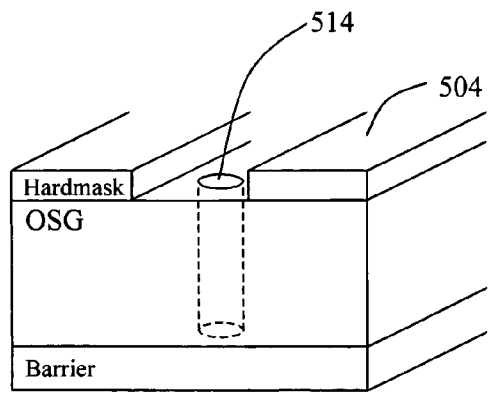

Referring to FIG. 5D there is shown the illustrative IC structure after adding another layer of photoresist 12 as described in process block 408. In FIG. 5E a via 514 is etched into the IC structure as described in block 410. FIG.

5F shows the IC structure after performing another $N_2O$ strip to remove the photoresist 512 as described in block 412.

Figure 5G:
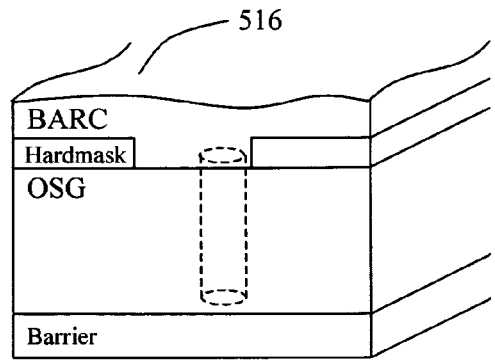
Figure 5H:
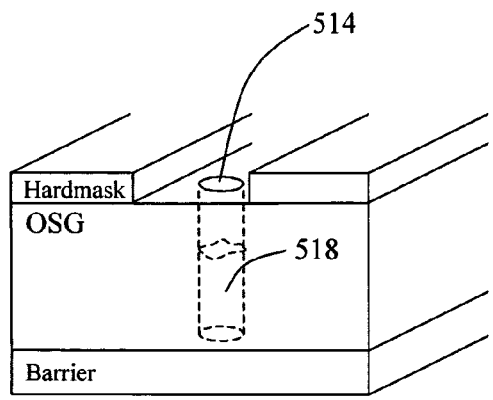
Figure 5I:
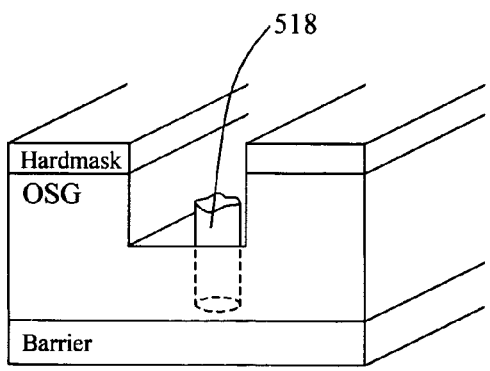
Figure 5J:
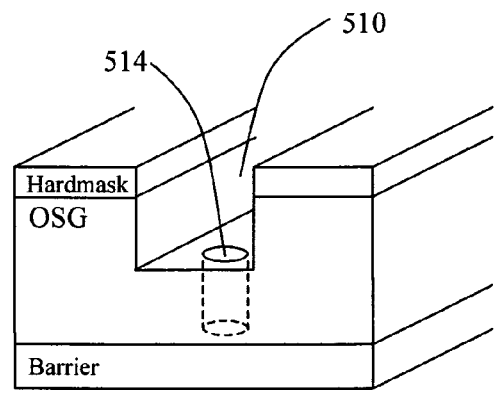

The organic plug is generated by first applying an organic material such as ARC 516 as described in block 414. The IC structure having the applied ARC 516 is shown in FIG. 5G. In FIG. 5H, there is shown the IC structure after an $N_2O$ gas described in block 416 is used to etch back the ARC 516 to produce the desired organic plug 518. At FIG. 5I, the OSG layer has been trench etched to the desired depth as described in block 418. Finally, FIG. 5J shows the resulting IC structure with the desired trench 510 and via 514. The resulting IC structure is generated by applying the $N_2O$ plasma described in block 420 to remove the organic plug.

Although the description about contains many limitations in the specification, these should not be construed as limiting the scope of the claims but as merely providing illustrations of some of the presently preferred embodiments of this invention. Many other embodiments will be apparent to those of skill in the art upon reviewing the description. Thus, the scope of the invention should be determined by the appended claims, along with the full scope of equivalents to which such claims are entitled.

What is claimed is:

1. A method of stripping an integrated circuit (IC) structure having a photoresist material, an organosilicate glass (OSG) material and a via etched into said IC structure, comprising:
    feeding a nitrous oxide ($N_2O$) gas into a reactor;
    generating a plasma in said reactor; stripping said photoresist;
    generating an organic plug that occupies said via, and stripping said organic plug with said $N_2O$ gas; and
    generating a high selectivity between said photoresist and said OSG.

2. The method of claim 1 wherein said photoresist is an organic photoresist.

3. The method of claim 2 wherein said stripping said photoresist is one of a plurality of steps performed during a dual damascene process.

4. The method of claim 3 wherein said stripping of said photoresist is performed in the same reactor used for etching said OSG material.

5. A method of stripping an integrated circuit (IC) structure including a first photoresist layer, a second intermediate layer, and a third organosilicate glass (OSG) layer, comprising:
    feeding a nitrous oxide ($N_2O$) gas into a reactor;
    generating a plasma in said reactor;
    stripping said photoresist with said plasma;
    generating a high selectivity between said first photoresist layer and said second intermediate layer;
    stripping said second intermediate layer with said plasma; and
    generating a high selectivity between said first photoresist layer and said third OSG layer.

6. The method of claim 5 wherein said photoresist is an organic photoresist.

7. The method of claim 5 wherein said stripping of said photoresist is performed in the same reactor used for etching said OSG layer.

8. The method of claim 5 wherein said stripping said photoresist is one of a plurality of steps performed during a dual damascene process.

9. The method of claim 5 wherein said second intermediate layer is a cap layer.

10. The method of claim 9 wherein said cap layer is selected from a group consisting of Silicon Dioxide ($SiO_2$) and Silicon Oxynitride (SiON).

11. The method of claim 5 wherein said second intermediate layer is a hardmask layer.

12. The method of claim 11 wherein said hardmask layer is selected from a group consisting of Silicon Nitride ($Si_3N_4$), Tantalum Nitride (TaN), Titanium Nitride (TiN), and Silicon Carbide (SiC).

13. A method of performing a via first etch with an IC structure including a first photoresist layer, a second cap layer, and a third organosilicate glass (OSG) layer, comprising:
    etching a via into said second cap layer and said third OSG layer;
    stripping said first photoresist layer with a nitrous oxide ($N_2O$) gas;
    generating an organic plug within said via; and
    stripping said organic plug with said $N_2O$ gas.

14. The method of claim 13 wherein said organic plug within said via occupies part of said third OSG layer.

15. The method of claim 14 further comprising, etching a trench into said second cap layer and said third OSG layer and applying another first photoresist layer.

16. The method of claim 14 further comprising, stripping said other first photoresist layer and said organic plug with said $N_2O$ gas.

17. The method of claim 16 wherein said photoresist is an organic photoresist.

18. The method of 17 wherein said stripping said photoresist is one of a plurality of steps performed during a dual damascene process.

19. A method of performing a trench first etch with an IC structure including a first photoresist layer, a second hardmask layer, and a third organosilicate glass (OSG) layer, comprising:
    etching a trench into said second hard mask layer;
    stripping said first photoresist layer with a nitrous oxide ($N_2O$) gas;
    applying another first photoresist layer for performing a via etch;
    etching a via into said second hardmask layer, and said third OSG layer;
    stripping said another first photoresist layer with said $N_2O$ gas;
    generating an organic plug within said via, and
    using said $N_2O$ gas to strip said organic plug.

20. The method of claim 19 wherein said organic plug within said via occupies part of said third OSG layer.

21. The method of claim 20 further comprising, etching a second trench into said third OSG layer.

22. The method of claim 21 further comprising, using said $N_2O$ gas to strip said organic plug.

* * * * *